United States Patent
Cho et al.

(10) Patent No.: US 11,430,836 B2
(45) Date of Patent: Aug. 30, 2022

(54) DISPLAY DEVICE AND MANUFACTURING METHOD THEREOF

(71) Applicant: ELECTRONICS AND TELECOMMUNICATIONS RESEARCH INSTITUTE, Daejeon (KR)

(72) Inventors: Hyunsu Cho, Daejeon (KR); Chan-mo Kang, Daejeon (KR); Byoung-Hwa Kwon, Daejeon (KR); Chunwon Byun, Daejeon (KR); Jin Wook Shin, Daejeon (KR); Hyunkoo Lee, Daejeon (KR); Sukyung Choi, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 189 days.

(21) Appl. No.: 16/680,724

(22) Filed: Nov. 12, 2019

(65) Prior Publication Data

US 2021/0005670 A1 Jan. 7, 2021

(30) Foreign Application Priority Data

Jul. 3, 2019 (KR) .................... 10-2019-0080045

(51) Int. Cl.
*H01L 27/32* (2006.01)
*H01L 51/56* (2006.01)
*H01L 51/00* (2006.01)

(52) U.S. Cl.
CPC ........ *H01L 27/322* (2013.01); *H01L 27/3216* (2013.01); *H01L 51/56* (2013.01); *H01L 51/0011* (2013.01)

(58) Field of Classification Search
CPC ..... H01L 27/3206–3218; H01L 27/322; H01L 51/50; H01L 51/0011; H01L 51/56; G09G 3/3208

See application file for complete search history.

(56) References Cited

U.S. PATENT DOCUMENTS 10,090,367 B2 10/2018 Choi et al.
2002/0030443 A1* 3/2002 Konuma ................. H01L 51/56
                                                                        313/504

(Continued)

FOREIGN PATENT DOCUMENTS

JP        2005-332589 A    12/2005
KR  10-2016-0077617 A       7/2016
KR  10-2018-0130357 A     12/2018

OTHER PUBLICATIONS

Amalkumar Ghosh, et al., "Ultra-High-Brightness 2K × 2K Full-Color OLED Microdisplay Using Direct Patterning of OLED Emitters", SID 2017 DIGEST, pp. 226-229, 2017.

*Primary Examiner* — Eric K Ashbahian
(74) *Attorney, Agent, or Firm* — Rabin & Berdo, P.C.

(57) ABSTRACT

A display device according to an embodiment of the inventive concept provides includes a substrate, a green light emitting element group and a blue light emitting element group, which are repeatedly arranged in a first direction parallel to a top surface of the substrate, and a red conversion pattern on the green light emitting element group and the blue light emitting element group. Here, the red conversion pattern overlaps a portion of the green light emitting element group and a portion of the blue light emitting element group in a second direction perpendicular to the top surface of the substrate.

14 Claims, 10 Drawing Sheets

(56) References Cited

U.S. PATENT DOCUMENTS

| | | |
|---|---|---|
| 2005/0275343 A1 | 12/2005 | Tanaka et al. |
| 2006/0238120 A1* | 10/2006 | Miller .................... H01L 27/322 |
| | | 313/506 |
| 2010/0176719 A1* | 7/2010 | Hirakata ............... H01L 25/048 |
| | | 313/504 |
| 2012/0032186 A1 | 2/2012 | Lee et al. |
| 2016/0043336 A1* | 2/2016 | Kim ...................... H01L 51/003 |
| | | 257/40 |
| 2016/0308132 A1 | 10/2016 | Chan et al. |
| 2017/0033317 A1* | 2/2017 | Kajimoto .............. H01L 51/504 |
| 2017/0117330 A1* | 4/2017 | Jiang ..................... H01L 27/322 |
| 2017/0207410 A1 | 7/2017 | Cho et al. |
| 2018/0120656 A1* | 5/2018 | Okada ................. G02F 1/13394 |
| 2019/0157357 A1* | 5/2019 | Lai ....................... H01L 51/5253 |
| 2019/0237520 A1* | 8/2019 | Tian .................... H01L 27/3218 |
| 2020/0185638 A1* | 6/2020 | Choi ................... H01L 27/3276 |

\* cited by examiner

DISPLAY DEVICE AND MANUFACTURING METHOD THEREOF

CROSS-REFERENCE TO RELATED APPLICATIONS

This U.S. non-provisional patent application claims priority under 35 U.S.C. § 119 of Korean Patent Application No. 10-2019-0080045, filed on Jul. 3, 2019, the entire contents of which are hereby incorporated by reference.

BACKGROUND

The present disclosure herein relates to a display device and a manufacturing method thereof, and more particularly, to a display device including an organic light emitting diode (OLED) element and a manufacturing method thereof.

Currently, a virtual reality (VR) device and an augmented reality (AR) device are spotlighted as a next generation display. As a display used for the above devices, a microdisplay attracts great attention.

The microdisplay may be classified into a liquid crystal on silicon (LCoS) using liquid crystal and an OLED on Silicon (OLEDoS) using an organic light-emitting diode (OLED).

In case of the OLEDoS, a CMOS process is necessary to form a micro-pixel, and an OLED element is formed on an electrode formed through the CMOS process. In general, in order to realize each of red, green, and blue colors in the OLEDoS, a white OLED is manufactured, and then each of the colors are realized through color filters.

SUMMARY

The present disclosure provides a structure of a display device having a high resolution.

The present disclosure also provides a method for efficiently manufacturing a display device having a high resolution.

The object of the present invention is not limited to the aforesaid, but other objects not described herein will be clearly understood by those skilled in the art from descriptions below.

An embodiment of the inventive concept provides a display device including: a substrate; a green light emitting element group and a blue light emitting element group, which are repeatedly arranged in a first direction parallel to a top surface of the substrate; and a red conversion pattern on the green light emitting element group and the blue light emitting element group. Here, the red conversion pattern overlaps a portion of the green light emitting element group and a portion of the blue light emitting element group in a second direction perpendicular to the top surface of the substrate.

In an embodiment, the green light emitting element group may include two green light emitting elements, and the blue light emitting element group may include two blue light emitting elements.

In an embodiment, the red conversion pattern may overlap one green light emitting element and one blue light emitting element, which are adjacent to each other in the first direction, in the second direction.

In an embodiment, the two green light emitting elements may share a green light emitting pattern, and the two blue light emitting elements may share a blue light emitting pattern.

In an embodiment, a width in the first direction of the red conversion pattern may be equal to or greater than a sum of a half of a width in the first direction of the green light emitting pattern and a half of a width in the first direction of the blue light emitting pattern, and less than a sum of the width in the first direction of the green light emitting pattern and the width in the first direction of the blue light emitting pattern.

In an embodiment, the display device may further include a red color filter disposed on the red conversion pattern.

In an embodiment, the display device may further include a window substrate disposed on the red conversion pattern.

In another embodiment of the inventive concept, a display device includes: a substrate including a first pixel area and a second pixel area, which are adjacent to each other; and a red pixel, a green pixel, and a blue pixel, which are disposed on each of the first pixel area and the second pixel area. Here, the red pixel of the first pixel area and the red pixel of the second pixel area are adjacent to each other in a first direction parallel to a top surface of the substrate.

In an embodiment, the red pixel may include a first red pixel and a second red pixel, the red pixel on the first pixel area may be a second red pixel and the red pixel on the second pixel area may be a first red pixel, the first red pixel may include a green light emitting element and a red conversion pattern on the green light emitting element, and the second red pixel may include a blue light emitting element and a red conversion pattern on the blue light emitting element.

In an embodiment, the substrate may further include a third pixel area and a fourth pixel area, which are adjacent to each other, the display device may include a red pixel, a green pixel, and a blue pixel, which are disposed on each of the third pixel area and the fourth pixel area, the red pixel of the third pixel area and the red pixel of the fourth pixel area may be adjacent to each other in the first direction, the red pixel of the third pixel area may be a first red pixel and the red pixel of the fourth pixel area may be a second red pixel, and the first to fourth pixel areas may be alternately and repeatedly disposed in the first direction.

In an embodiment, the green pixel, the blue pixel, and the second red pixel may be disposed in the first direction on the first pixel area, the first red pixel, the green pixel, and the blue pixel may be disposed in the first direction on the second pixel area, the blue pixel, the green pixel, and the first red pixel may be disposed in the first direction on the third pixel area, and the second red pixel, the blue pixel, and the green pixel may be disposed in the first direction on the fourth pixel area.

In an embodiment of the inventive concept, a method for manufacturing a display device includes: forming a plurality of electrodes on a first area and a second area of a substrate in a first direction parallel to a top surface of the substrate; forming a green light emitting pattern on the first area; forming a blue light emitting pattern on the second area; and forming a red conversion pattern configured to cover a portion of the green light emitting pattern and a portion of the blue light emitting pattern. Here, the first area and the second area are alternately disposed in the substrate.

In an embodiment, the green light emitting pattern may be formed on two electrodes that are adjacent to each other in the first direction, and the blue light emitting pattern may be formed on two electrodes that are adjacent to each other in the first direction.

In an embodiment, the forming of the green light emitting pattern may include selectively depositing a green light emitting material on the first area through a first mask including a first opening, and the forming of the blue light emitting pattern may include selectively depositing a blue light emitting material on the second area through a second mask including a second opening.

In an embodiment, a width in the first direction of the first opening may be equal to or greater than a sum of two times of a width in the first direction of the electrode and a spaced distance between a pair of adjacent electrodes in the first direction, and a width in the first direction of the second opening may be equal to or greater than a sum of two times of a width in the first direction of the electrode and a spaced distance between a pair of adjacent electrodes in the first direction.

In an embodiment, the forming of the red conversion pattern may include: forming a red conversion layer on the green light emitting pattern and the blue light emitting pattern; and patterning the red conversion layer.

In an embodiment, the pattering of the red conversion layer may include a photolithography process.

In an embodiment, the photolithography process may include an exposure process through a third mask including a third opening, and the third opening may overlap a portion of the green light emitting pattern and a portion of the blue light emitting pattern in a second direction perpendicular to the top surface of the substrate.

In an embodiment, a width in the first direction of the third opening may be equal to or greater than a sum of a half of a width in the first direction of the green light emitting pattern and a half of a width in the first direction of the blue light emitting pattern.

In an embodiment, the forming of the red conversion pattern may include: forming a red conversion layer on a window substrate; pattering the red conversion layer; and attaching one surface of the window substrate, on which the patterned red conversion layer is formed, on the green light emitting pattern and the blue light emitting pattern.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Exemplary embodiments of the present invention will be described with reference to the accompanying drawings so as to sufficiently understand constitutions and effects of the present invention. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims. Also, in the figures, the dimensions of layers and regions are exaggerated for clarity of illustration.

Unless terms used in embodiments of the present invention are differently defined, the terms may be construed as meanings that are commonly known to a person skilled in the art. Hereinafter, embodiments of the inventive concept will be described in detail with reference to the accompanying drawings.

Figure 1A:
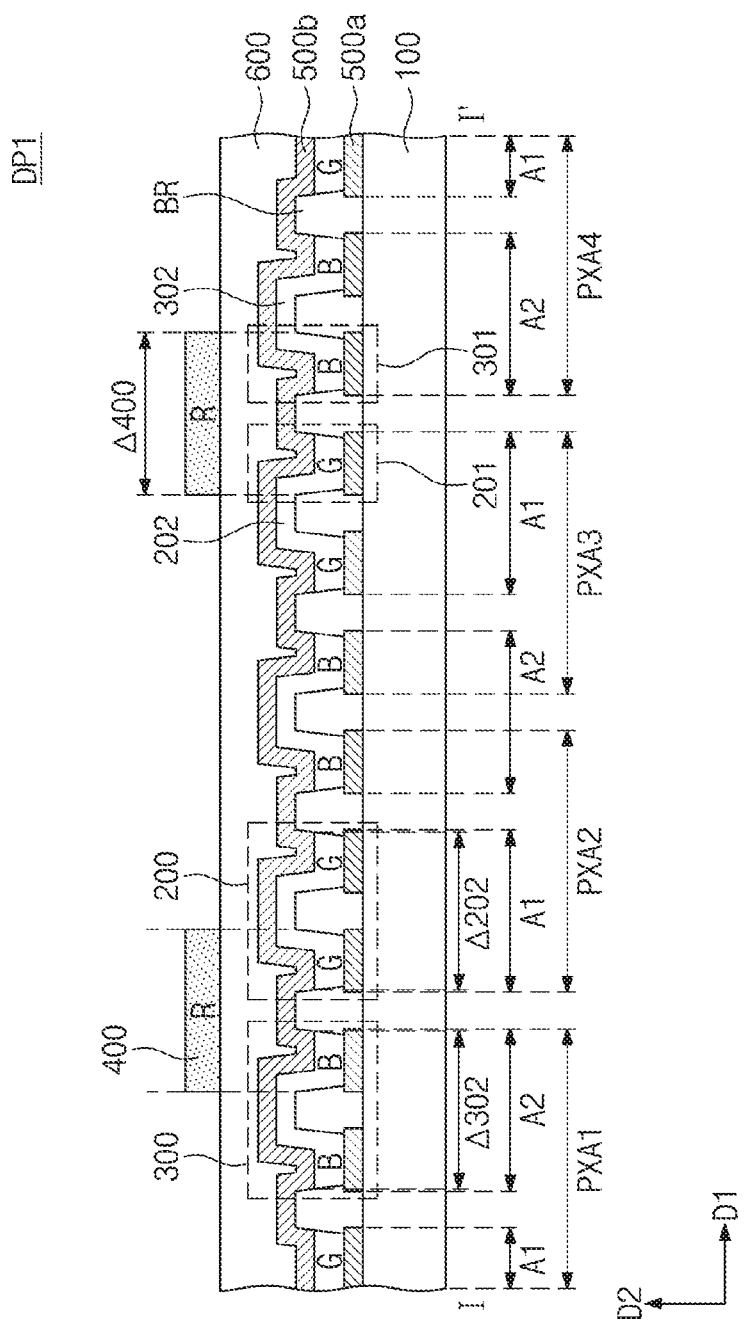
FIG. 1A is a cross-sectional view illustrating a display device according to a first embodiment of the inventive concept.

FIG. 1A is a cross-sectional view illustrating a display device according to a first embodiment of the inventive concept.

Referring to FIG. 1A, a display device DP1 according to the first embodiment of the inventive concept may include a substrate 100, green light emitting element groups 200, blue light emitting element groups 300, an encapsulation layer 600, and red conversion patterns 400.

The substrate 100 may include a silicon substrate. In detail, the substrate 100 may include a silicon substrate and a semiconductor pattern provided on the silicon substrate. The display device including a green light emitting element 201 and a blue light emitting element 301 on the substrate 100 may be an organic light emitting display on silicon (OLEDoS) applied to a microdisplay.

The substrate 100 may include a first area A1 and a second area A2, which are repeatedly and alternately disposed in a first direction D1 on a top surface of the substrate 100. The first area A1 may be an area in which the green light emitting element group 200 is disposed on the substrate 100. The second area A2 may be an area in which the blue light emitting element group 300 is disposed on the substrate 100.

One green light emitting element group 200 may include, e.g., two green light emitting elements 201. One blue light emitting element group 300 may include, e.g., two blue light emitting elements 301.

The green light emitting element 201 may include a first electrode 500a, a second electrode 500b on the first electrode, and a green light emitting pattern 202 disposed between the first electrode 500a and the second electrode 500b.

The blue light emitting element 301 may include a first electrode 500a, a second electrode 500b on the first electrode, and a green light emitting pattern 202 disposed between the first electrode 500a and the second electrode 500b.

Each of the first electrodes 500a may be an anode. The first electrodes 500a may be spaced apart from each other in the first direction D1 on the substrate 100. Each of the first electrode 500a may be a reflective electrode. A pixel separation film BR may be disposed between the first electrodes 500a. The pixel separation film BR may overlap an end of the first electrode 500a in a second direction D2 perpendicular to the top surface of the substrate 100, and each of the green light emitting pattern 202 and the blue light emitting pattern 302 may be distinguished in a pixel unit.

Two green light emitting elements 201, which are adjacent to each other in the first direction D1, may share one green light emitting pattern 202. That is, the green light emitting pattern 202 may cover top surfaces of two adjacent first electrodes 500a on the first area A1 and extend over a top surface and side surfaces of the pixel separation film BR between the two adjacent first electrodes 500a. The green light emitting pattern 202 may overlap the two adjacent first electrodes 500a in the second direction D2.

The green light emitting pattern 202 may be electrically connected with the first electrode 500a and the second electrode 500b to emit green light.

Two blue light emitting elements 301, which are adjacent to each other in the first direction D1, may share one blue light emitting pattern 302. That is, the blue light emitting pattern 302 may cover top surfaces of two adjacent first electrodes 500a on the second area A2 and extend over a top surface and side surfaces of the pixel separation film BR between the two adjacent first electrodes 500a. The blue light emitting pattern 302 may overlap the two adjacent first electrodes 500a in the second direction D2.

The blue light emitting pattern 302 may be electrically connected with the first electrode 500a and the second electrode 500b to emit blue light.

Each of the green light emitting pattern 202 and the blue light emitting pattern 302 may have a structure of a plurality of laminated layers or a single layer. Each of the green light emitting pattern 202 and the blue light emitting pattern 302 may include a host material or a dopant material.

The second electrode 500b may be a cathode. The second electrode 500b may cover the green light emitting elements 201 and the blue light emitting elements 301 in common. The green light emitting elements 201 and the blue light emitting elements 301 may share the second electrode 500b. The second electrode 500b may be a transmissive or transflective electrode.

Although not shown, a hole injection layer and a hole transporting layer, which are for smoothly injecting a hole, may be disposed below the green light emitting pattern 202 and the blue light emitting pattern 302. Also, an electron transporting layer and an electron injection layer, which are for smoothly injecting an electron, may be disposed on the green light emitting pattern 202 and the blue light emitting pattern 302.

The encapsulation layer 600 covering the green light emitting element groups 200 and the blue light emitting element groups 300 may be provided. The encapsulation layer 600 may be disposed on the second electrode 500b. The encapsulation layer 600 may include a plurality of organic layers and a plurality of inorganic layers. The encapsulation layer 600 may protect the second electrode 500b from external moisture.

A plurality of red conversion patterns 400 may be provided on the encapsulation layer 600. Each of the red conversion patterns 400 may be disposed on a portion of the green light emitting element groups 200 and a portion of the blue light emitting element groups 300 in the second direction D2. In detail, one red conversion pattern 400 may overlap one green light emitting element 201 and one blue light emitting element 301, which are adjacent to each other, in the second direction D2.

The red conversion pattern 400, the green light emitting pattern 202, and the blue light emitting pattern 302 may have widths Δ400, Δ202, and Δ302 in the first direction D1, respectively. The width Δ400 in the first direction D1 of the red conversion pattern 400 may be equal to or greater than a sum of the width Δ202 in the first direction D1 of the green light emitting pattern 202 and the width Δ302 in the first direction D1 of the blue light emitting pattern 302.

Alternatively, the width Δ400 in the first direction D1 of the red conversion pattern 400 may be less than the sum of the width Δ202 in the first direction D1 of the green light emitting pattern 202 and the width Δ302 in the first direction D1 of the blue light emitting pattern 302.

The red conversion pattern 400 may include quantum dots (not shown). The quantum dots (not shown) may be controlled to convert green light and blue light, which pass through the red conversion pattern 400, into red light by the quantum confinement effect.

Figure 1B:
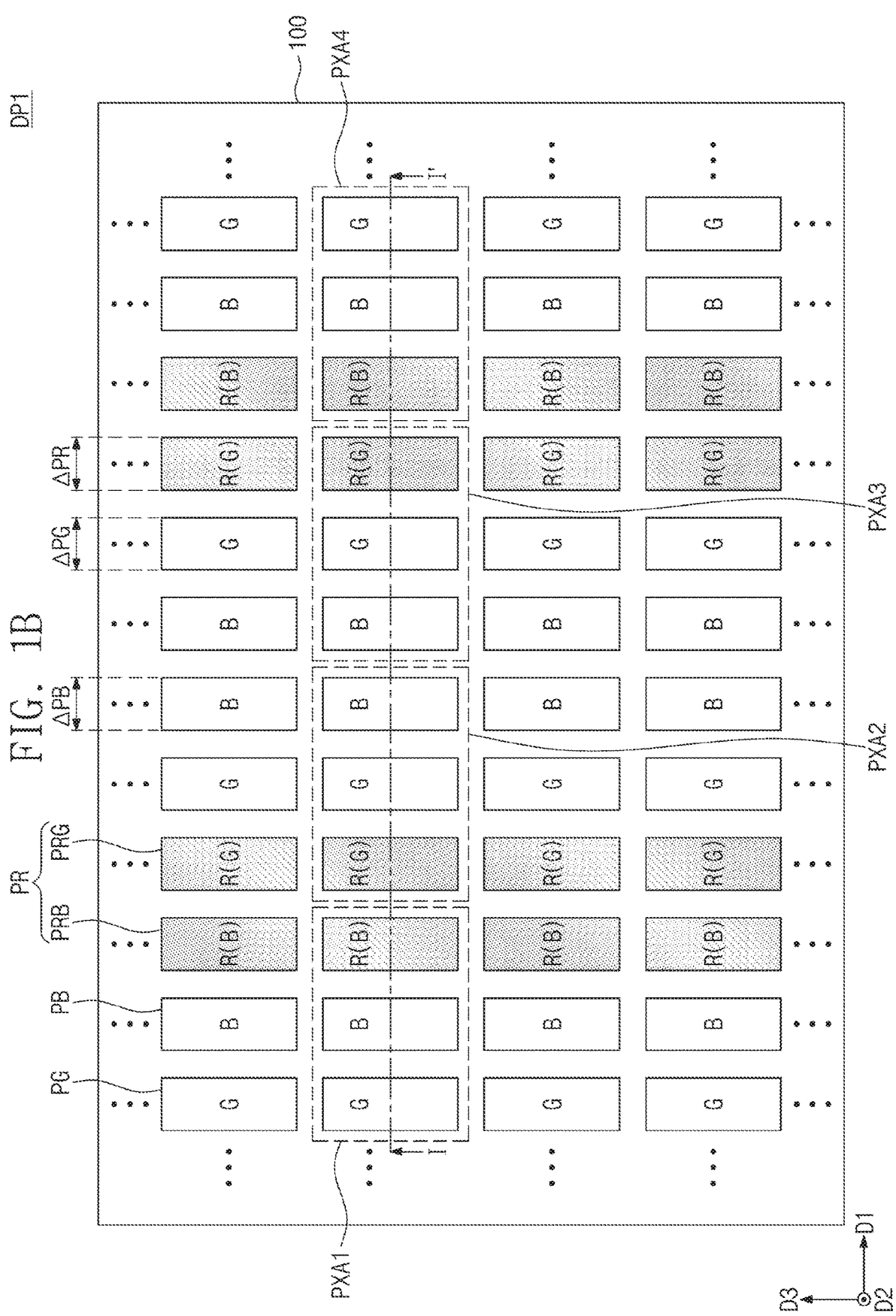
FIG. 1B is a conceptual plan view taken along line I-I' of FIG. 1A.

FIG. 1B is a conceptual plan view taken along line I-I' of FIG. 1A. In FIG. 1B, some components in FIG. 1A are omitted to clearly illustrate components.

Referring to FIGS. 1A and 1B, the display device DP1 according to the first embodiment of the inventive concept a first pixel area PXA1, a second pixel area PXA2, a third pixel area PXA3, and a fourth pixel area PXA4, which are alternately and repeatedly disposed in the first direction D1.

A red pixel PR, a green pixel PG, and a blue pixel PB, which are unit pixels, may be disposed on each of the first, second, third, and fourth pixel areas PXA1, PXA2, PXA3, and PXA4.

The red pixel PR may include a first red pixel PRG and a second red pixel PRB. The first red pixel PRG may include the green light emitting element 201 and the red conversion pattern 400 disposed on the green light emitting element 201. The second red pixel PRB may include the blue light emitting element 301 and the red conversion pattern 400 disposed on the blue light emitting element 301. The green pixel PG may include the green light emitting element 201, and the blue pixel PB may include the blue light emitting element 301. For example, as the green light emitting element group 200 and the blue light emitting element group 300 are alternately disposed in the first direction D1, and the red conversion pattern 400 is disposed to cover a portion of the green light emitting element group 200 and a portion of the blue light emitting element group 300, the red pixel PR, the green pixel PG, and the blue pixel PB constitute one pixel, and, through this, a full color display device may be realized.

The red pixel PR, the green pixel PG, and the blue pixel PB may have widths ΔPR, ΔPG, and ΔPB in the first direction D1, respectively.

The width Δ202 in the first direction D1 of the green light emitting pattern 202 may be equal to or greater than two times of the width ΔPG in the first direction D1 of the green pixel PG. The width Δ302 in the first direction D1 of the blue light emitting pattern 302 may be equal to or greater than two times of the width ΔPB in the first direction D1 of the blue pixel PB. The width Δ400 in the first direction D1 of the red conversion pattern 400 may be equal to or greater than two times of the width ΔPR in the first direction D1 of the red pixel PR.

On the first pixel area PXA1, the green pixel PG, the blue pixel PB, and the second red pixel PRB may be sequentially disposed in the first direction D1. On the second pixel area PXA2, the first red pixel PRG, the green pixel PG, and the blue pixel PB may be sequentially disposed in the first direction D1. On the third pixel area PXA3, the blue pixel PB, the green pixel PG, and the first red pixel PRG may be sequentially disposed in the first direction D1. On the fourth pixel area PXA4, the second red pixel PRB, the blue pixel PB, and the green pixel PG may be sequentially disposed in the first direction D1.

The second red pixel PRB of the first pixel area PXA1 and the first red pixel PRG of the second pixel area PXA2 may be disposed adjacent to each other. The first red pixel PRG of the third pixel area PXA3 and the second red pixel PRB of the fourth pixel area PXA4 may be disposed adjacent to each other.

The red pixels PR may be arranged in a third direction D3 that is parallel to the top surface of the substrate 100 and perpendicular to the first direction D1. Likewise, each of the green pixels PG and the blue pixels PB may be arranged in the third direction D3. However, the embodiment of the inventive concept is not limited thereto. For example, the red, green, and blue pixels PR, PG, and PB may be differently arranged in the third direction D3.

FIGS. 2A to 2D are cross-sectional views illustrating a method for manufacturing the display device according to the first embodiment of the inventive concept.

Figure 2A:
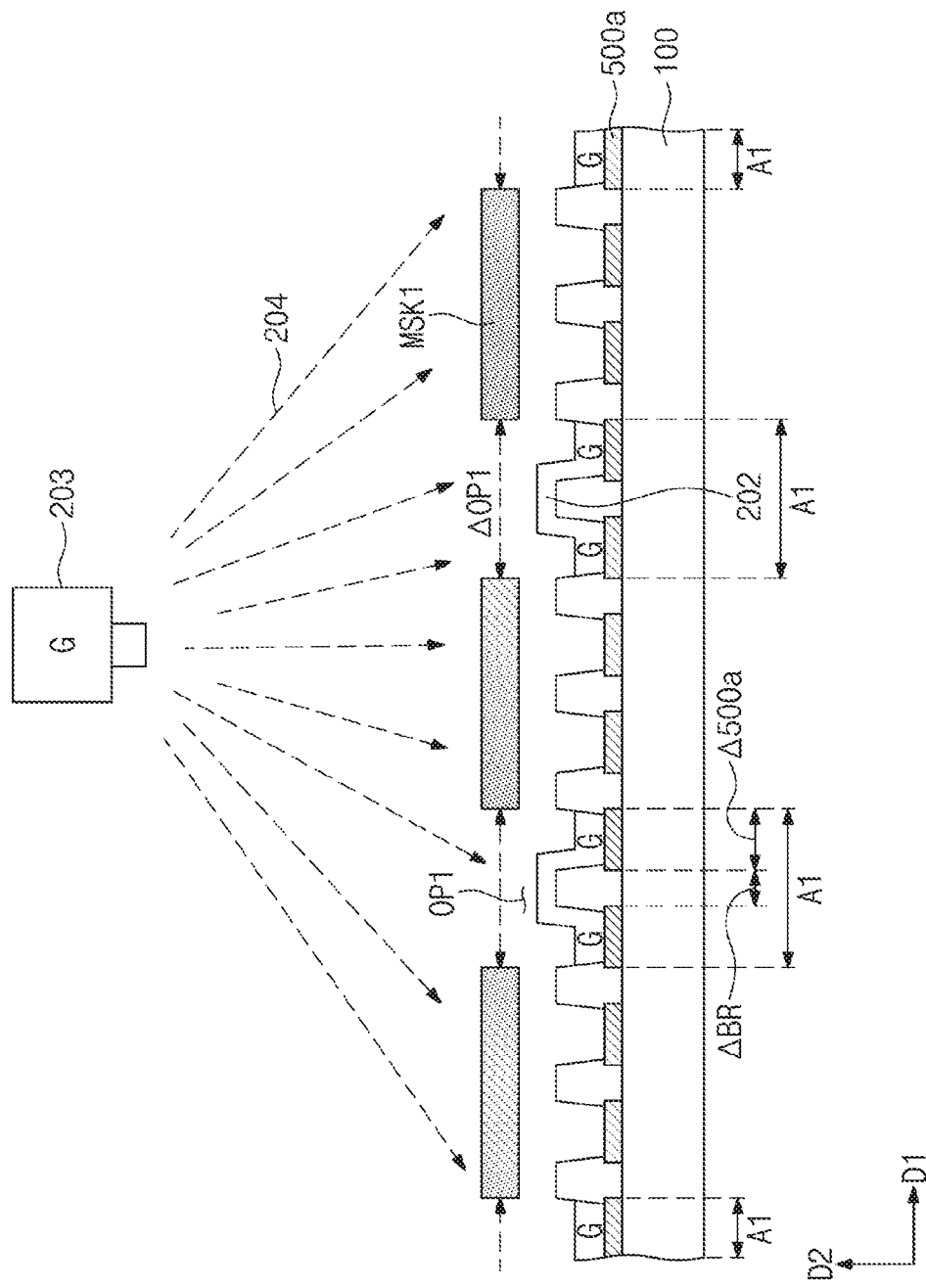
FIGS. 2A to 2D are cross-sectional views illustrating a method for manufacturing the display device according to the first embodiment of the inventive concept.

Referring to FIG. 2A, the green light emitting pattern 202 may be selectively formed on the first area A1 of the substrate 100. The plurality of first electrodes 500a and the pixel separation films BR are alternately and repeatedly disposed on the substrate 100. The green light emitting pattern 202 may cover the top surfaces of two adjacent first electrodes 500a and extend over the top surface and side surfaces of the pixel separation film BR disposed between the two adjacent first electrodes 500a.

The green light emitting pattern 202 may be formed by a first deposition material 204 sprayed toward the top surface of the substrate 100 from a first deposition source 203 spaced apart from the top surface of the substrate 100. The first deposition material 204 may be a green light emitting material. The first deposition material 204 may include a host material and a dopant material.

A first mask MSK1 may be provided between the first deposition source 203 and the substrate 100 while being spaced apart from the top surface of the substrate 100. The first mask MSK1 may be a fine metal mask. The first mask MSK1 may include a first opening OP1, and the first deposition material 204 may be deposited on the first area A1 through the first opening OP1.

A width ΔOP1 in the first direction D1 of the first opening OP1 may be equal to or greater than each of two times of a width Δ500a in the first direction D1 of the first electrode 500a and a sum of a spaced distance ΔBR in the first direction D1 between a pair of first electrodes 500a that are adjacent to each other. The spaced distance ΔBR in the first direction D1 between a pair of first electrodes 500a that are adjacent to each other may be substantially the same as a mean of widths in the first direction D1 of the pixel separation films BR.

Although the first opening OP1 may overlap a pair of first electrodes 500a, which are consecutive in the first direction D1, in the second direction D2, the first opening OP1 may not overlap three first electrodes 500a, which are consecutive in the first direction D1, in the second direction D2. That is, an upper limit of the width ΔOP1 in the first direction D1 of the first opening OP1 may be adjusted as described above.

Although not shown, before the green light emitting pattern 202 is formed, a hole injection layer and a hole transporting layer, which cover the first electrodes 500a, may be sequentially formed. The hole injection layer and the hole transporting layer may be formed through a deposition process using an open mask.

Figure 2B:
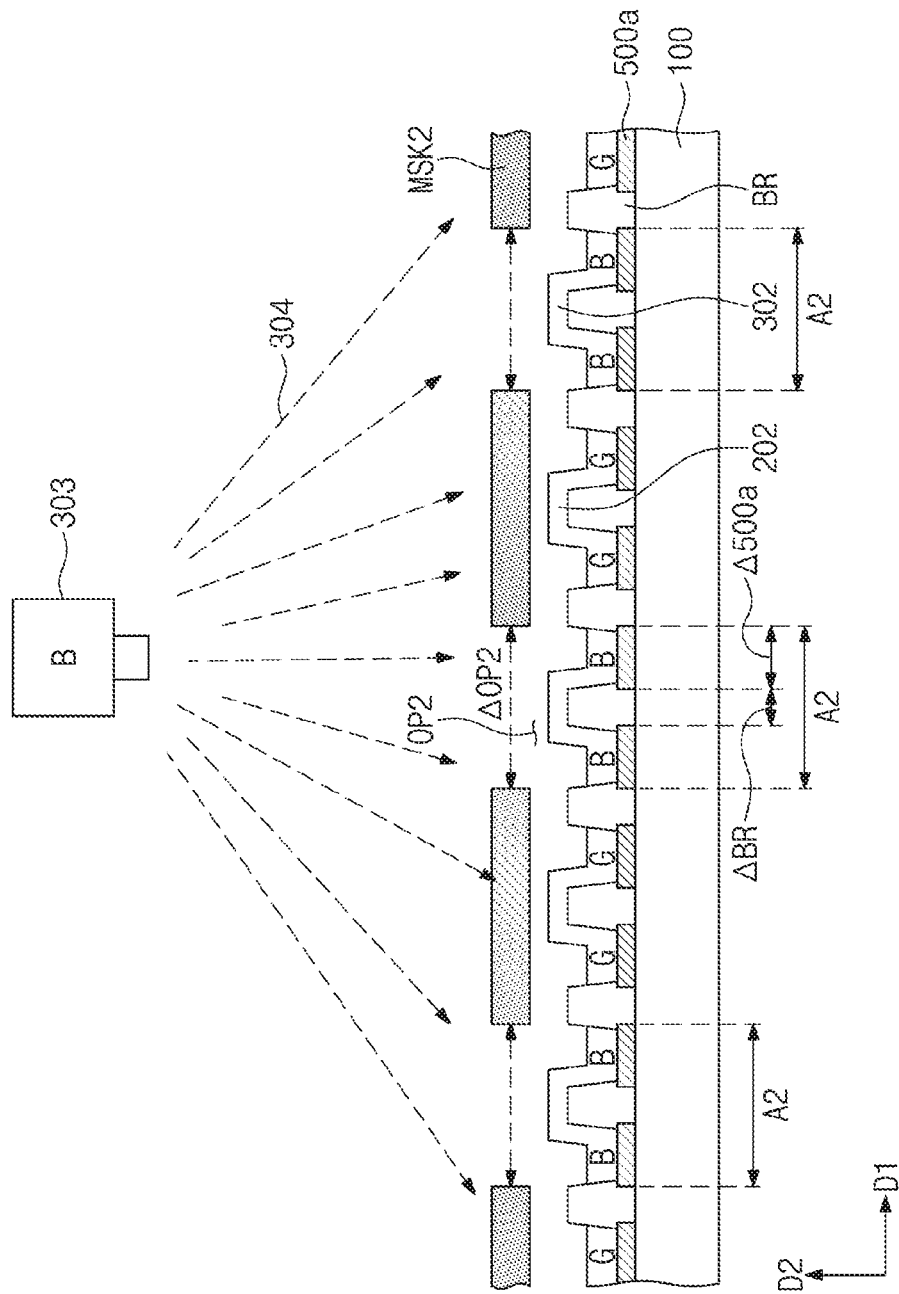

Referring to FIG. 2B, the blue light emitting pattern 302 may be selectively formed on the second area A2 of the substrate 100. The blue light emitting pattern 302 may cover the top surfaces of two adjacent first electrodes 500a and extend over the top surface and side surfaces of the pixel separation film BR disposed between the two adjacent first electrodes 500a.

The blue light emitting pattern 302 may be formed by a second deposition material 304 sprayed toward the top surface of the substrate 100 from a second deposition source 303 spaced apart from the top surface of the substrate 100. The second deposition material 304 may be a blue light emitting material. The second deposition material 304 may include a host material and a dopant material.

A second mask MSK2 may be provided between the second deposition source 303 and the substrate 100 while being spaced apart from the top surface of the substrate 100. The second mask MSK2 may be a fine metal mask. The second mask MSK2 may include a second opening OP2, and the second deposition material 304 may be deposited on the second area A2 through the second opening OP2.

A width ΔOP2 in the first direction D1 of the second opening OP2 may be equal to or greater than each of two times of a width Δ500a in the first direction D1 of the first electrode 500a and a sum of a spaced distance ΔBR in the first direction D1 between a pair of first electrodes 500a that are adjacent to each other.

Although the second opening OP2 may overlap a pair of first electrodes 500a, which are consecutive in the first direction D1, in the second direction D2, the second opening OP2 may not overlap three first electrodes 500a, which are consecutive in the first direction D1, in the second direction D2. That is, an upper limit of the width ΔOP2 in the first direction D1 of the second opening OP2 may be adjusted as described above.

Although not shown, a hole injection layer and a hole transporting layer, which cover the green light emitting pattern 202 and the blue light emitting pattern 302, may be sequentially formed. The hole injection layer and the hole transporting layer may be formed through a deposition process using an open mask.

Unlike as described above in FIGS. 2A and 2B, the blue light emitting pattern 302 may be formed earlier than the green light emitting pattern 202. That is, a formation order of the green light emitting pattern 202 and the blue light emitting pattern 302 will be fine in all cases.

Figure 2C:
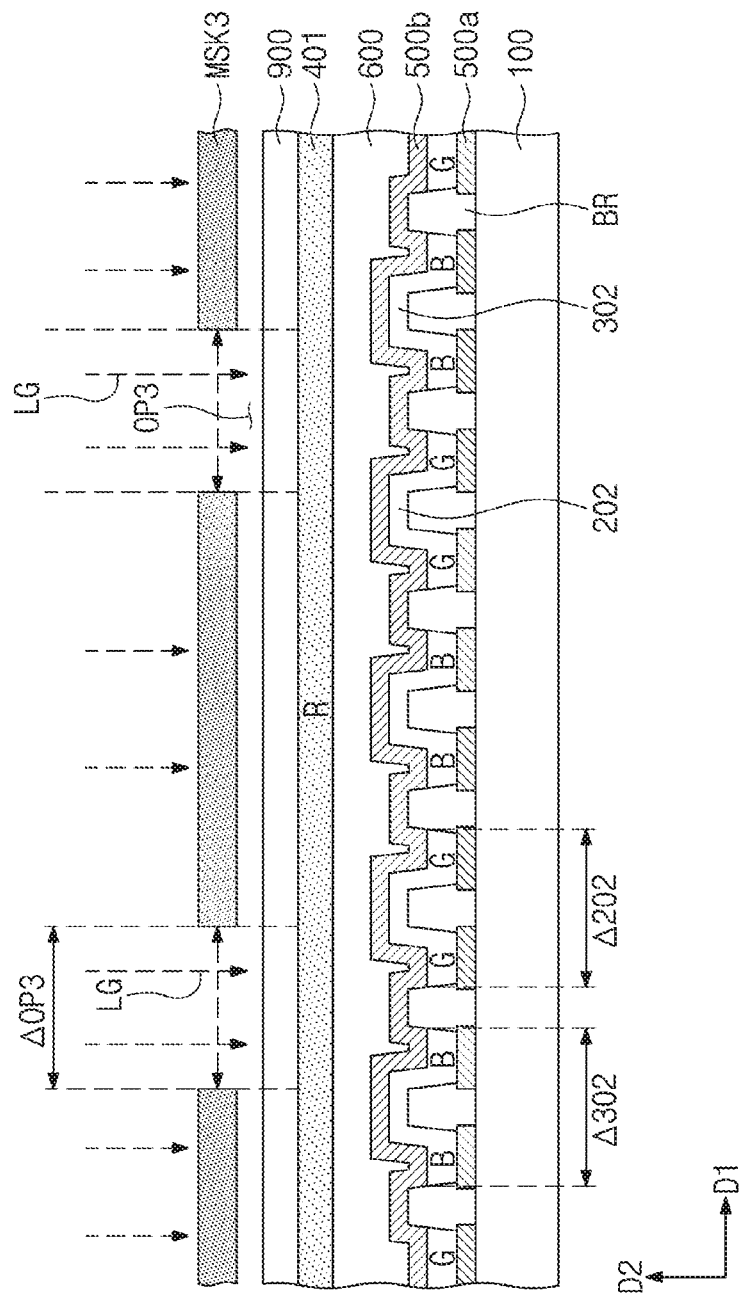
Figure 2D:
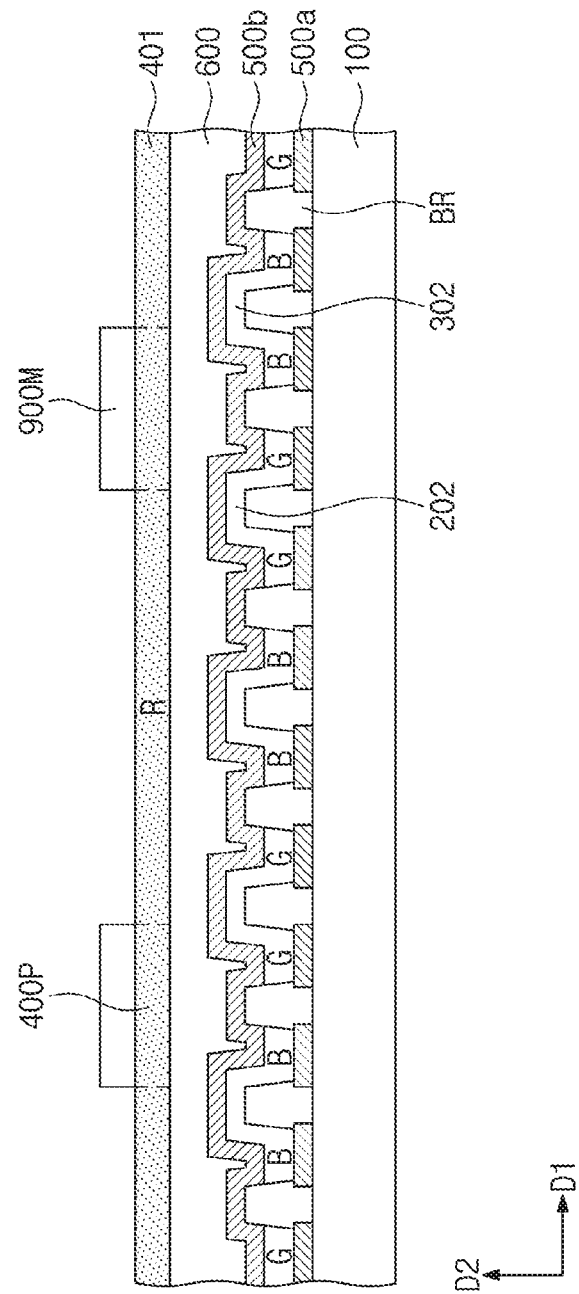

Referring to FIG. 2C, an encapsulation layer 600 covering the green light emitting pattern 202 and the blue light emitting pattern 302 may be formed. Although not shown, an adhesive layer may be provided between the encapsulation layer 600 and the second electrode 500b. A red conversion layer 401 may be formed on the encapsulation layer 600. The red conversion layer 401 may be applied over the entire first and second areas A1 and A2. The red conversion layer 401 may include quantum dots (not shown). The quantum dots (not shown) may convert green light and blue light passing through the red conversion layer 401 and be adjusted to emit red light by the quantum confinement effect.

Thereafter, a patterning process of the red conversion layer 401 may be performed. The patterning process may include, e.g., a photolithography process. The photolithography process may include forming, exposure, and developing processes of a photoresist film 900 and a selective etching process of the red conversion layer 401.

In detail, the photoresist film 900 may be formed on the red conversion layer 401. Thereafter, the exposure process may be performed on the photoresist film 900 through a third mask MSK3 including a third opening OP3. For example, the photoresist film 900 may include negative photoresist compositions.

The third opening OP3 may overlap a portion of the green light emitting element group 200 and a portion of the blue light emitting element group 300. In detail, the third opening OP3 may overlap one green light emitting element 201 and one blue light emitting element 301, which are adjacent to each other in the second direction D2.

A width ΔOP3 in the first direction D1 of the third opening OP3 may be equal to or greater than a sum of a half of a width Δ202 in the first direction D1 of the green light emitting pattern 202 and a half of a width Δ302 in the first direction D1 of the blue light emitting pattern 302.

The width ΔOP3 in the first direction D1 of the third opening OP3 may be equal to or greater than each of two times of a width Δ500a in the first direction D1 of the first electrode 500a and a sum of a spaced distance ΔBR in the first direction D1 between a pair of first electrodes 500a that are adjacent to each other.

Although the third opening OP3 may overlap a pair of first electrodes 500a, which are consecutive in the first direction D1, in the second direction D2, the third opening OP3 may not overlap three first electrodes 500a, which are consecutive in the first direction D1, in the second direction D2. That is, an upper limit of the width ΔOP3 in the first direction D1 of the third opening OP3 may be adjusted as described above.

Referring to FIGS. 2D and 1B again, the red conversion pattern 400 may be formed. First, the developing process of the photoresist film 900 may be performed. An exposed portion of the photoresist film 900 may serve as an etching mask 900M in a following etching process. Except for the etching mask 900M, the rest portion of the photoresist film 900 may be removed.

Thereafter, the etching process of the red conversion layer 401 may be performed. As the rest portion of the red conversion layer 401 except for an area 400P protected by the etching mask 900M is etched by the etching process, the red conversion pattern 400 may be formed. Thereafter, the etching mask 900M on the red conversion pattern 400 may be removed.

Figure 3:
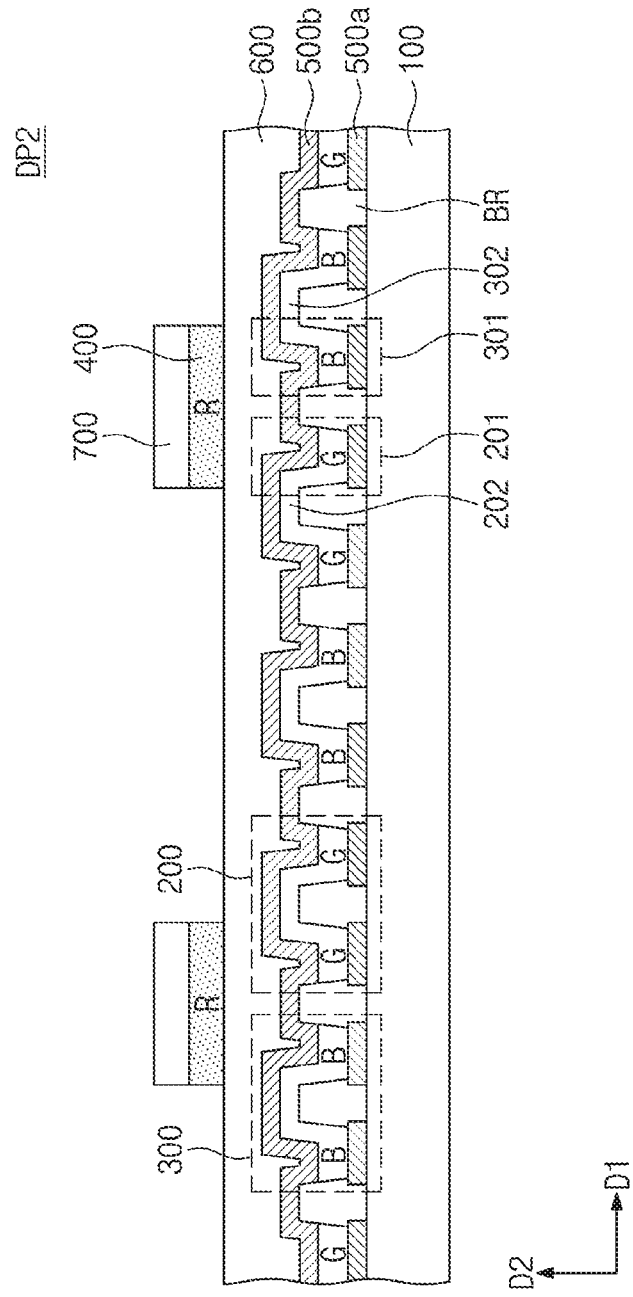
FIG. 3 is a cross-sectional view illustrating a display device according to a second embodiment of the inventive concept.

FIG. 3 is a cross-sectional view illustrating a display device according to a second embodiment of the inventive concept. Except for features described below, other features are described in detail with reference to FIGS. 1A and 1B, and thus additional description thereof will be omitted.

Referring to FIG. 3, a display device DP2 according to the second embodiment of the inventive concept may further include a red color filter 700. The red color filter 700 may be provided on the red conversion pattern 400.

When a portion of green light and/or blue light passing through the red conversion pattern 400 is not color-converted, the red color filter 700 may not transmit light in a different wavelength from the red light.

Figure 4:
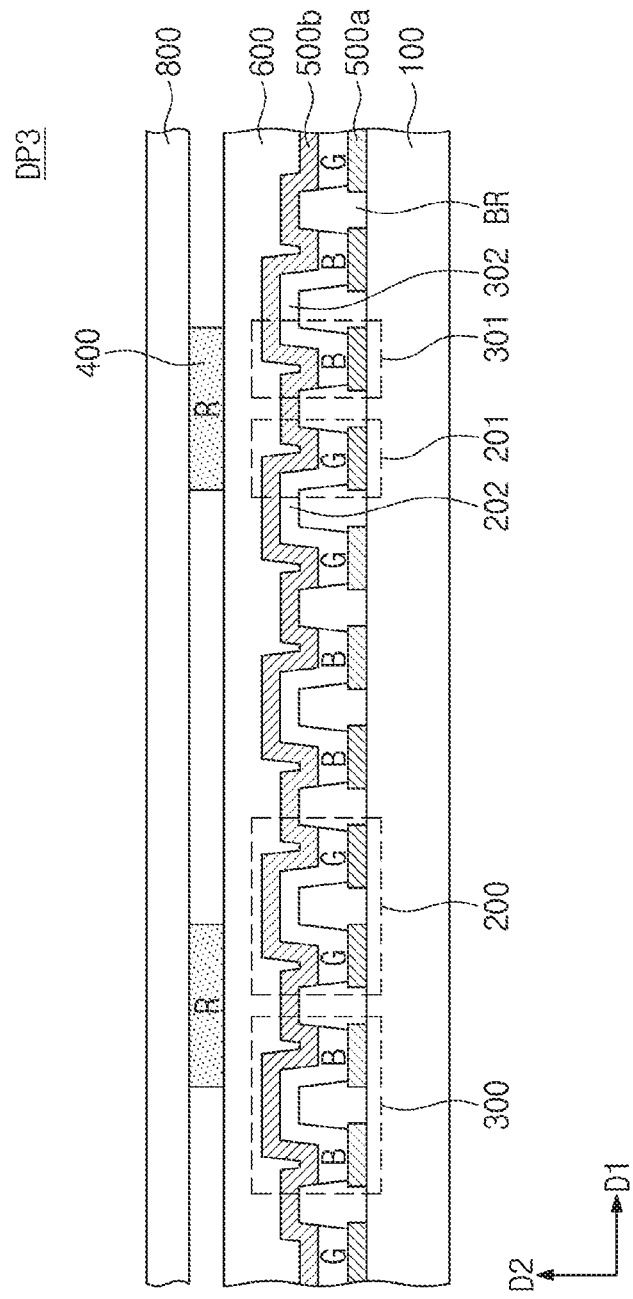
FIG. 4 is a cross-sectional view illustrating a display device according to a third embodiment of the inventive concept.

FIG. 4 is a cross-sectional view illustrating a display device according to a third embodiment of the inventive concept. Except for features described below, other features are described in detail with reference to FIGS. 1A and 1B, and thus additional description thereof will be omitted.

Referring to FIG. 4, a display device DP3 according to the third embodiment of the inventive concept may further include a window substrate 800. The window substrate 800 may be a layer having transparency and including glass or a polymer.

The window substrate 800 may be disposed on the encapsulation layer 600 with the red conversion pattern 400 therebetween. Although not shown, an adhesive layer may be disposed between the window substrate 800 and the encapsulation layer 600. The window substrate 800 may be a separate substrate in which the red conversion pattern 400 is formed and then a surface on which the red conversion pattern 400 is formed is laminated to face the green light emitting elements 201 and the blue light emitting elements 301 as will be described later.

Figure 5A:
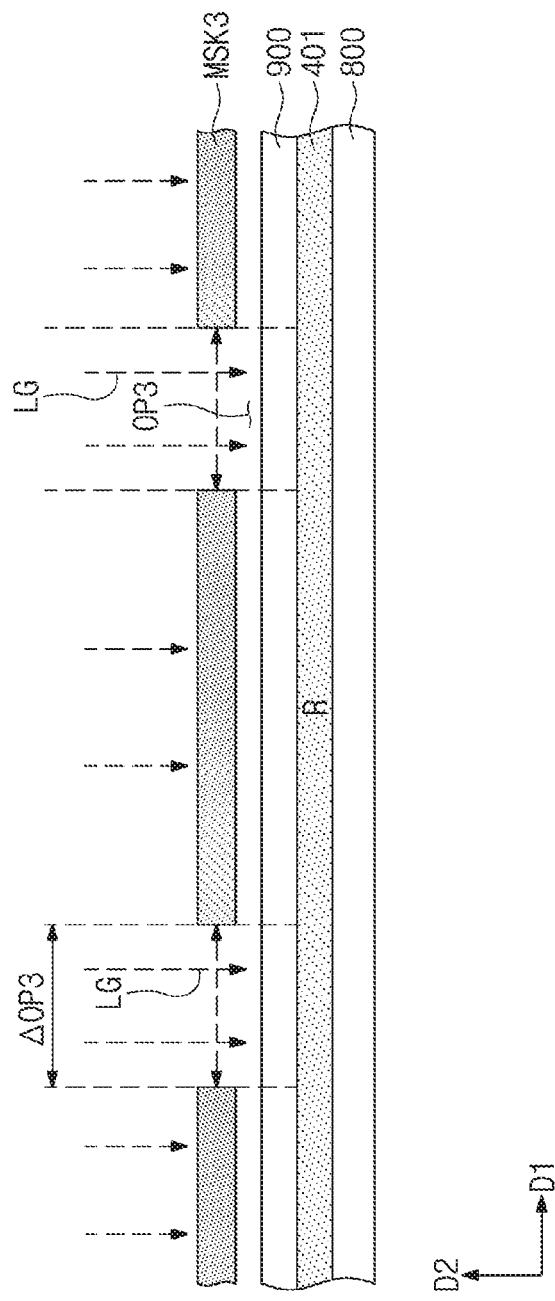
FIGS. 5A, 5B and 5C are cross-sectional views illustrating a method for manufacturing the display device according to the third embodiment of the inventive concept.
Figure 5B:
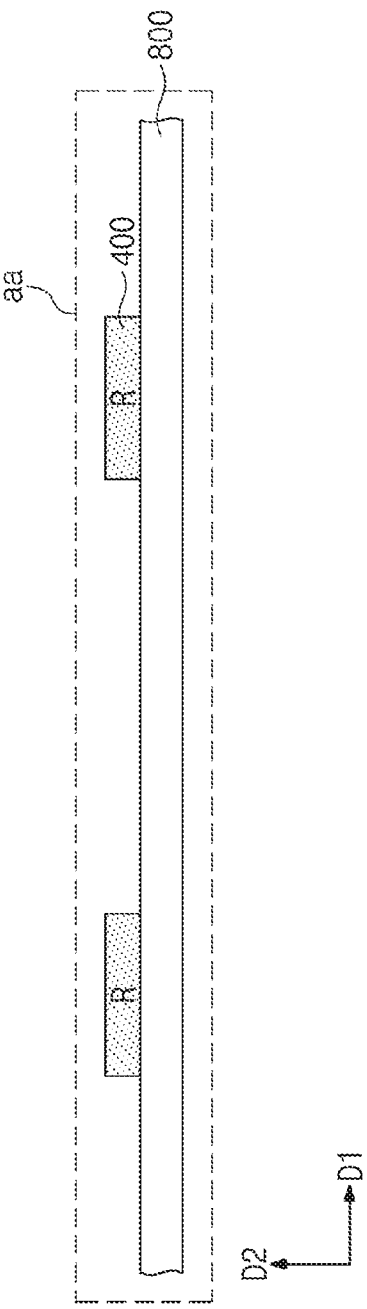
Figure 5C:
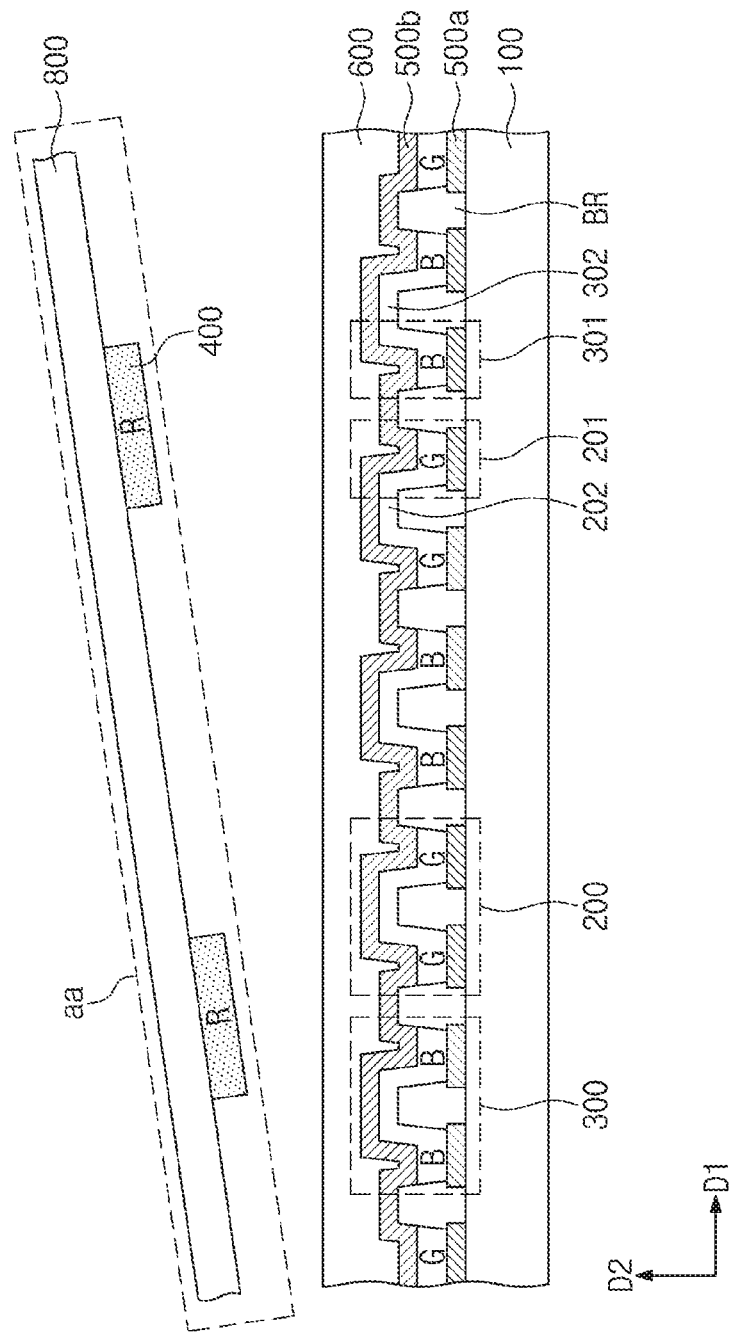

FIGS. 5A to 5C are cross-sectional views illustrating a method for manufacturing the display device according to the second embodiment of the inventive concept. Except for features described below, other features are described in detail with reference to FIGS. 2A and 2B, and thus additional description thereof will be omitted.

Referring to FIG. 5A, the red conversion layer 401 may be formed on the window substrate 800. The photoresist film 900 may be formed on the red conversion layer 401. Thereafter, an exposure process LG may be performed on the photoresist film 900 through the third mask MSK3 including the third opening OP3.

Referring to FIG. 5B, as the red conversion layer 401 is pattered, the red conversion pattern 400 may be formed on the window substrate 800. In detail, as the photoresist film 900 is exposed and developed, an etching mask (not shown) may be formed. Through an etching process, an area of the red conversion layer 401, which is not protected by the etching mask, may be etched. Thereafter, as the etching mask is removed, a laminated member aa including the red conversion pattern 400 and the window substrate 800 may be formed.

Referring to FIG. 4 again in conjunction with FIG. 5C, a surface of the window substrate 800 on which the red conversion pattern 400 of the laminated member aa is formed may be attached to face the encapsulation layer 600. The window substrate 800 may be attached on the encapsulation layer 600 to overlap a portion of the green light emitting element group 200 and a portion of the blue light emitting element group 300 in the second direction D2. The red conversion pattern 400 may be attached to overlap one green light emitting element 201 and one blue light emitting element 301 in the second direction D2.

In the method for manufacturing the display device according to an embodiment of the inventive concept, each of the green light emitting pattern and the blue light emitting pattern may be deposited to have a width equal to or greater than two times of a width of each of a green pixel and a blue pixel, which are formed when a deposition process is performed. In case of a deposition process using a shadow mask (e.g., a fine metal mask), patterning is difficult to be adjusted as a width of a pixel decreases. Thus, as a light emitting material is deposited to have a width of two times or more, the patterning may be easily adjusted, and a desired width of a pixel may be precisely formed. In case of a typical deposition process, since a width of a pixel is substantially the same as a width of an opening of a mask, the patterning is hardly adjusted as a pixel to be formed has a minute width.

As the red conversion pattern is formed on a portion of the green light emitting pattern and a portion of the blue light emitting pattern by using a photolithography process, the red pixel having a minute width may be realized. As a result, as the red pixel, the green pixel, and the blue pixel each having a minute width are formed, the display device having a high resolution may be realized.

Also, in comparison with a case of using a color filter after a white OLED is formed, since blue light and green light are realized without color filters, the blue light and the green light each having a high efficiency may be realized.

The high resolution may be realized through the display device according to the embodiment of the inventive concept, and the display device may be efficiently produced through the method for manufacturing the display device according to the embodiment of the inventive concept.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed. Thus, the above-disclosed embodiments are to be considered illustrative and not restrictive.

What is claimed is:

1. A display device comprising:
a substrate;
a green light emitting element group and a blue light emitting element group, which are alternately arranged in a first direction parallel to a top surface of the substrate; and
a red conversion pattern on the green light emitting element group and the blue light emitting element group and crossing the green light emitting element group and the blue light emitting element group,
wherein
the green light emitting element group comprises a first green light emitting element and a second green light emitting element,
the blue light emitting element group comprises a first blue light emitting element and a second blue light emitting element,
the first green light emitting element, the second green light emitting element, the first blue light emitting element and the second blue light emitting element are sequentially arranged along the first direction,
the first green light emitting element comprises a first electrode,
the second green light emitting element includes a second electrode,
the first green light emitting element and the second green light emitting element further comprise a green light emitting pattern having one end connected to the first electrode and another end connected to the second electrode,
the first blue light emitting element comprises a third electrode,
the second blue light emitting element comprises a fourth electrode,
the first blue light emitting element and the second blue light emitting element further comprise a blue light emitting pattern having one end connected to the third electrode and the other end connected to the fourth electrode,
the green light emitting pattern, the blue light emitting pattern, and the red conversion pattern each have a continuous structure shape along the first direction, and
edge regions of the red conversion pattern overlap the second electrode and the third electrode in a second direction perpendicular to a top surface of the substrate.

2. The display device of claim 1, wherein a width in the first direction of the red conversion pattern is equal to or greater than a sum of a half of a width in the first direction of the green light emitting pattern and a half of a width in the first direction of the blue light emitting pattern, and less than a sum of the width the first direction of the green light emitting pattern and the width in the first direction of the blue light emitting pattern.

3. The display device of claim 1, further comprising a red color filter disposed on the red conversion pattern.

4. The display device of claim 1, further comprising a window substrate disposed on the red conversion pattern.

5. A display device comprising:
a substrate comprising a first pixel area and a second pixel area, which are adjacent to each other, wherein the first pixel area and the second pixel area are disposed along a first direction parallel to a top surface of the substrate;
a first green pixel, a first blue pixel, and a first red pixel sequentially arranged in the first pixel area along the first direction; and
a second red pixel, a second green pixel, and a second blue pixel sequentially arranged in the first direction in the second pixel area;
wherein the first red pixel and the second red pixel are disposed adjacent to each other in the first direction; and
wherein the first red pixel comprises a green light emitting element and a red conversion pattern on the green light emitting element, and
the second red pixel comprises a blue light emitting element and the red conversion pattern on the blue light emitting element.

6. The display device of claim 5, wherein
the substrate further comprises a third pixel area and a fourth pixel area disposed adjacent to each other in the first direction;
the third pixel area comprises a third blue pixel, a third green pixel, and a third red pixel sequentially arranged along the first direction; and
the fourth pixel area comprises a fourth red pixel, a fourth blue pixel, and a fourth green pixel sequentially arranged in the first direction;
wherein the first to fourth pixel areas are alternately and repeatedly disposed in the first direction.

7. A method for manufacturing a display device, comprising:
forming a first electrode and a second electrode on a first region of a substrate;
forming a third electrode and a fourth electrode on a second region of the substrate, wherein the first to fourth electrodes are sequentially disposed along a first direction parallel to a top surface of the substrate;
forming a green light emitting pattern on the first electrode and the second electrode, one end of the green light emitting pattern being connected to the first electrode, and another end of the green light emitting pattern being connected to a second electrode;
forming a blue light emitting pattern on the third electrode and the fourth electrode, one end of the blue light emitting pattern being connected to the third electrode, and another end of the blue light emitting pattern being connected to the fourth electrode; and
forming a red conversion pattern on the second electrode and the third electrode that vertically overlaps the second electrode and the third electrode,
wherein the green light emitting pattern, the blue light emitting pattern, and the red conversion pattern each have a shape of a continuous structure extending in the first direction.

8. The method of claim 7, wherein the forming of the green light emitting pattern comprises selectively depositing a green light emitting material on the first electrode, the second electrode, and a region therebetween through a first mask comprising a first opening, and
the forming of the blue light emitting pattern comprises selectively depositing a blue light emitting material on the third electrode, the fourth electrode, and a region therebetween through a second mask comprising a second opening.

9. The method of claim 8, wherein a width in the first direction of the first opening is equal to or greater than a sum of a width of the first electrode in the first direction, a width of the second electrode in the first direction, and a first width therebetween in the first direction and a width in the first direction of the second opening is equal to or greater than a sum of a width of the third electrode in the first direction, a width of the fourth electrode in the first direction, and a second width therebetween in the first direction.

10. The method of claim 7, wherein the forming of the red conversion pattern comprises:
   forming a red conversion layer on the green light emitting pattern and the blue light emitting pattern; and
   patterning the red conversion layer.

11. The method of claim 10, wherein the patterning of the red conversion layer comprises a photolithography process.

12. The method of claim 11, wherein the photolithography process comprises an exposure process through a third mask comprising a third opening, and
   the third opening overlaps a portion of the green light emitting pattern and a portion of the blue light emitting pattern in a second direction perpendicular to the top surface of the substrate.

13. The method of claim 12, wherein a width in the first direction of the third opening is equal to or greater than a sum of a half of a width in the first direction of the green light emitting pattern and a half of a width in the first direction of the blue light emitting pattern.

14. The method of claim 7, wherein the forming of the red conversion pattern comprises:
   forming a red conversion layer on a window substrate;
   patterning the red conversion layer; and
   attaching one surface of the window substrate, on which the patterned red conversion layer is formed, on the green light emitting pattern and the blue light emitting pattern.

* * * * *